United States Patent [19]
Mori

[11] Patent Number: 5,294,566
[45] Date of Patent: Mar. 15, 1994

[54] METHOD OF PRODUCING A SEMICONDUCTOR INTEGRATED CIRCUIT DEVICE COMPOSED OF A NEGATIVE DIFFERENTIAL RESISTANCE ELEMENT AND A FET TRANSISTOR

[75] Inventor: Toshihiko Mori, Isehara, Japan

[73] Assignee: Fujitsu Limited, Kawasaki, Japan

[21] Appl. No.: 915,621

[22] Filed: Jul. 21, 1992

Related U.S. Application Data

[60] Division of Ser. No. 696,266, Apr. 30, 1991, Pat. No. 5,162,877, which is a continuation of Ser. No. 148,528, Jan. 26, 1988, abandoned.

[30] Foreign Application Priority Data

Jan. 27, 1987 [JP] Japan ................................. 62-016715

[51] Int. Cl.$^5$ ...................... H01L 21/44; H01L 21/48
[52] U.S. Cl. .................... 437/184; 437/176; 437/59; 437/31
[58] Field of Search ............... 437/184, 176, 59, 31, 437/185, 187; 257/20-25, 187, 189

[56] References Cited

U.S. PATENT DOCUMENTS

| | | | |
|---|---|---|---|
| 3,974,486 | 8/1976 | Curtis et al. | 357/57 |
| 4,032,961 | 6/1977 | Baliga et al. | 357/57 |
| 4,064,525 | 12/1977 | Kano et al. | 357/57 |
| 4,143,286 | 3/1979 | Koike et al. | 357/41 |
| 4,219,829 | 8/1980 | Dorda et al. | 357/57 |
| 4,329,705 | 5/1982 | Baker | 357/43 |
| 4,449,140 | 5/1984 | Board | 357/57 |
| 4,622,573 | 11/1986 | Bakeman, Jr. et al. | 357/12 |
| 4,721,983 | 1/1988 | Frazier | 357/4 |
| 4,786,957 | 11/1988 | Muto | 257/26 |
| 4,788,662 | 11/1988 | Mori | 357/57 |
| 4,825,264 | 4/1989 | Inata et al. | 257/23 |
| 4,868,418 | 9/1989 | Imamura | 257/25 |
| 4,885,615 | 12/1989 | Warner, Jr. et al. | 357/41 |

FOREIGN PATENT DOCUMENTS

| | | |
|---|---|---|
| 0144242 | 6/1985 | European Pat. Off. . |
| 0240567 | 10/1987 | European Pat. Off. . |
| 58-107662 | 6/1983 | Japan . |
| 58-153365 | 9/1983 | Japan . |
| 60-120551 | 6/1985 | Japan . |

OTHER PUBLICATIONS

"Integration of a Resonant-Tunneling Structure with a Metal-Semiconductor Field-Effect Transistor", Woodward et al., Applied Physics Letters 51, (19), Nov. 9, 1987, pp. 1542-1544.

*Primary Examiner*—Olik Chaudhuri
*Assistant Examiner*—H. Jey Tsai
*Attorney, Agent, or Firm*—Armstrong, Westerman, Hattori, McLeland & Naughton

[57] ABSTRACT

A semiconductor integrated circuit device comprising a negative differential resistance element, such as an RHET and RBT, and a field effect transistor, such as an SBFET and heterojunction type FET, which are formed on the same semiconductor substrate, a base layer of the negative differential resistance element and a channel layer of the field effect transistor being formed on the same epitaxial layer, and the same conductive material is used to simultaneously form an emitter electrode and a gate. A monolithic integration of both the element and transistor can be achieved both rationally and easily.

5 Claims, 10 Drawing Sheets

Fig. IA
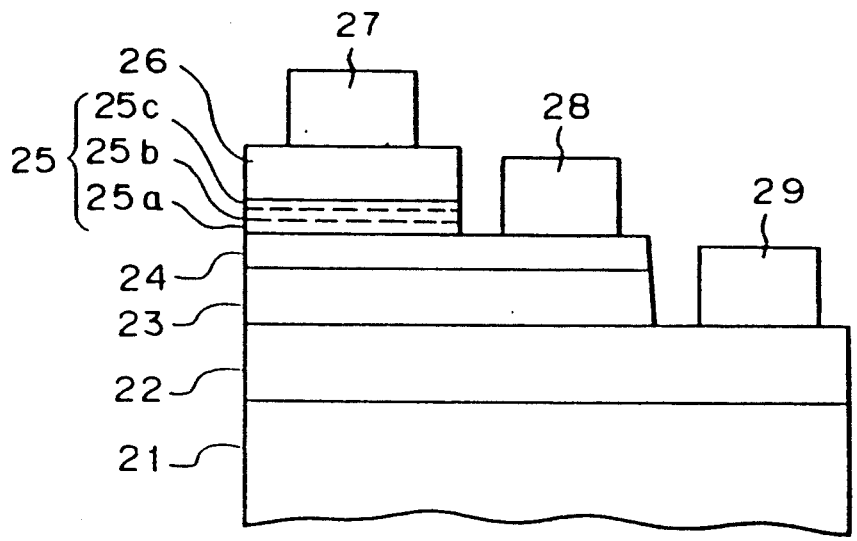
Fig. IB
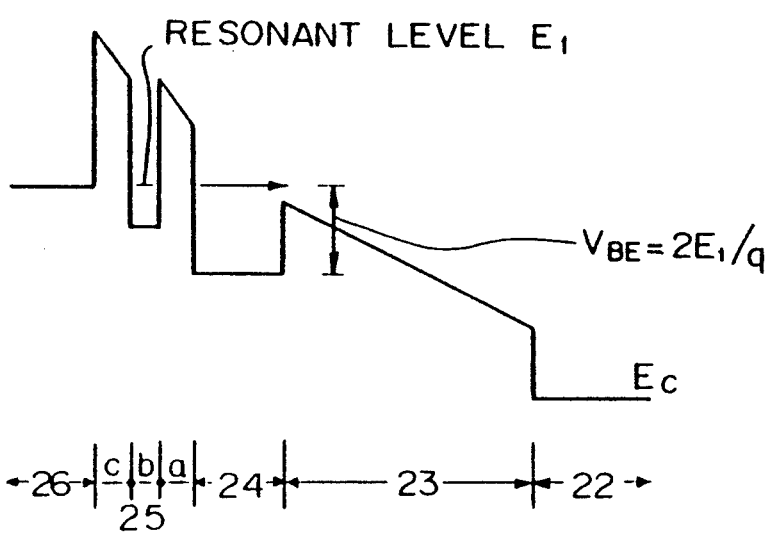

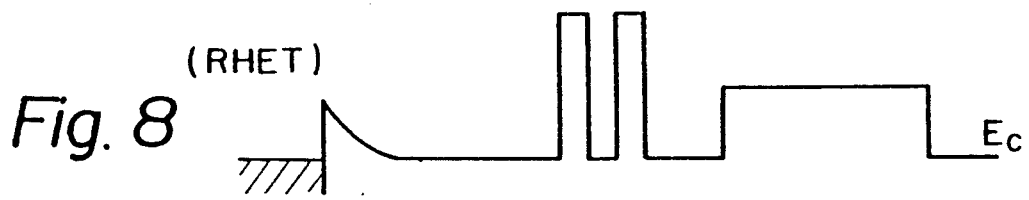
Fig. 8 (RHET)
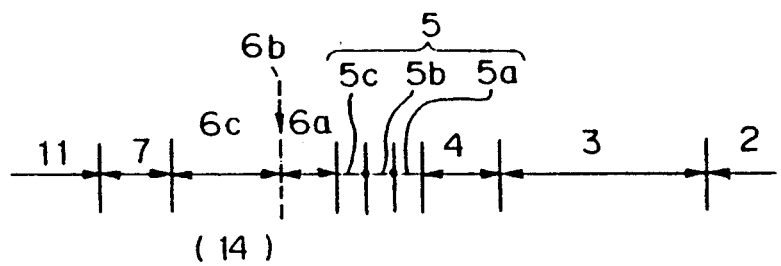
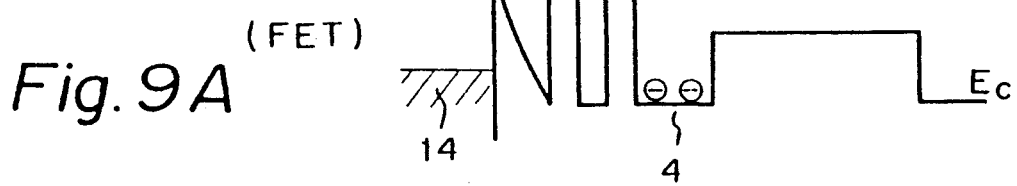
Fig. 9A (FET)
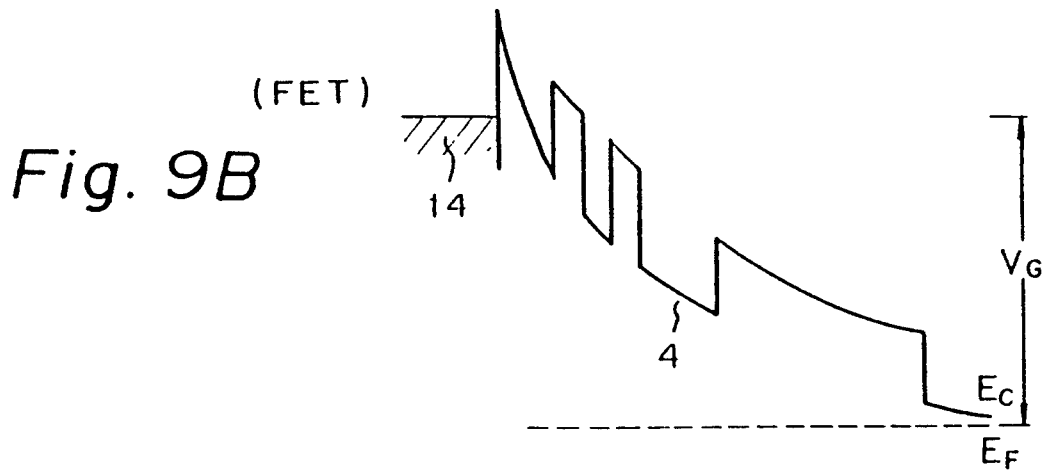
Fig. 9B (FET)

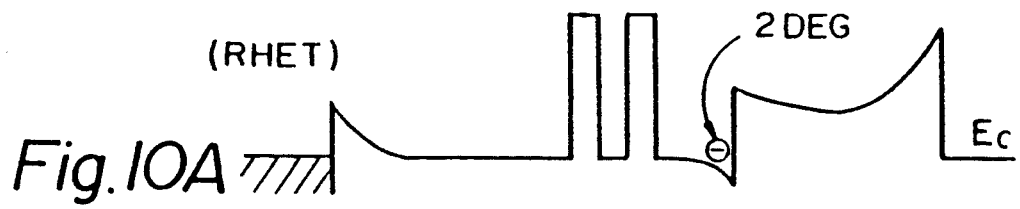
Fig.10A
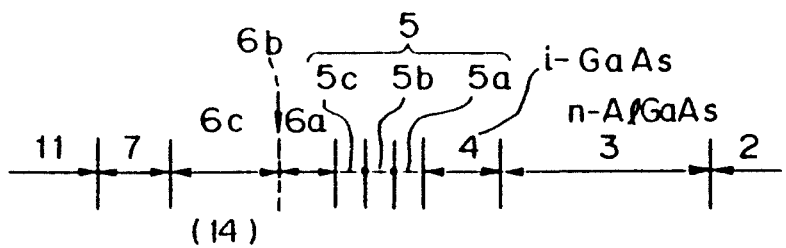
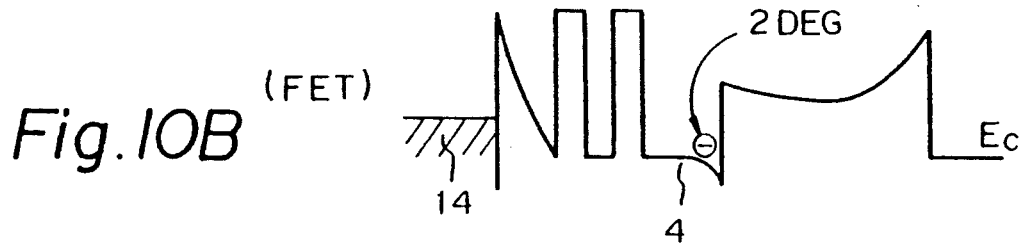
Fig.10B
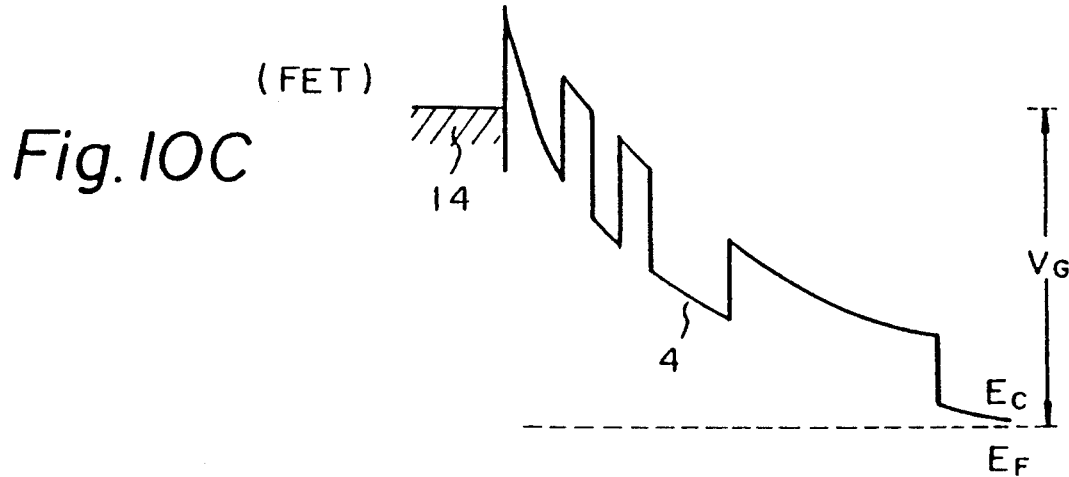
Fig.10C

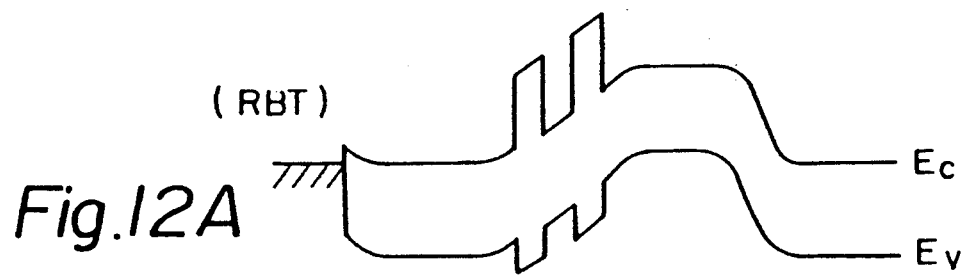
Fig. 12A
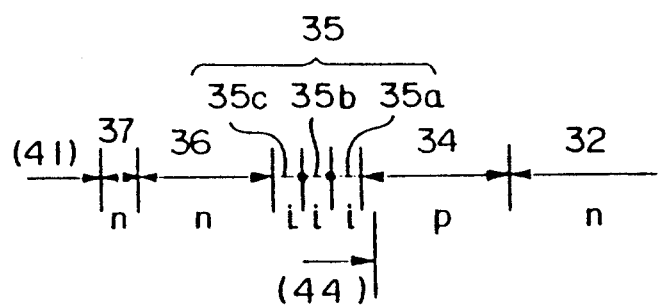
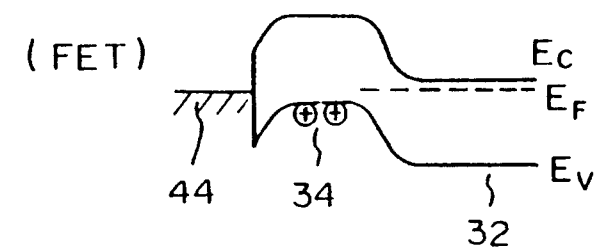
Fig. 12B
Fig. 12C

METHOD OF PRODUCING A SEMICONDUCTOR INTEGRATED CIRCUIT DEVICE COMPOSED OF A NEGATIVE DIFFERENTIAL RESISTANCE ELEMENT AND A FET TRANSISTOR

This is a division of application Ser. No. 696,266 filed Apr. 30, 1991, now U.S. pat. No. 5,162,877, which in turn is a continuation of application Ser. No. 148,528 filed Jan. 26, 1988, now abandoned.

BACKGROUND OF THE INVENTION

1. Field of the Invention

The present invention relates to a semiconductor device, and more particularly, to a semiconductor integrated circuit device comprising a field effect transistor (FET) and a negative differential resistance element, such as a resonant tunneling hot electron transistor (RHET) and a resonant tunneling bipolar transistor (RBT), which are monolithically integrated, and a method of producing the same.

Recently, much research has been made into semiconductor devices provided with novel functions by using heterojunctions of compound semiconductor layers, especially, a resonant tunneling barrier structure. The negative differential resistance elements have the functions described below, and further development of the circuits including these elements is expected.

2. Description of the Related Art

FIG. 1 is a schematic sectional view of an RHET, as one example of the differential negative resistance elements. The RHET comprises a semiinsulating GaAs substrate 21, the semiconductor layers 22 to 26 as shown in Table 1, an emitter electrode 27, a base electrode 28, and a collector electrode 29.

TABLE 1

| Semiconductor Layer | Composition | Impurity Dosage (cm$^{-3}$) | Thickness (nm) |
|---|---|---|---|
| 22 Collector | GaAs | n − 1 × 10$^{18}$ | 300–500 |
| 23 Collector Barrier | Al$_{0.2}$Ga$_{0.8}$As | Undoped | 100–300 |
| 24 Base | GaAs | n − 1 × 10$^{18}$ | 20–100 |
| 25 Emitter Barrier | | | |
| 25a | Al$_{0.3}$Ga$_{0.7}$As | Undoped | 3–5 |
| 25b | GaAs | Undoped | 3–5 |
| 25c | Al$_{0.3}$Ga$_{0.7}$As | Undoped | 3–5 |
| 26 Emitter | GaAs | n − 1 × 10$^{18}$ ≈400 |

The emitter barrier layer 25 between the emitter and base of the RHET has a resonant tunneling barrier structure having a quantum well, in which the GaAs well layer 25b is sandwiched between the AlGaAs barrier layers 25a and 25c, and electron energy levels in the quantum well correspond to the discrete values, i.e., resonant levels.

The RHET of the negative differential resistance element is operated by providing the base 24 and the collector 22 with potentials positive to the emitter 26. As shown in an energy band diagram of the RHET of FIG. 1B, when the electron energy level in the emitter 26 corresponds to the resonant level $E_1$, namely, when a base voltage $V_{BE}$ between the emitter 26 and the base 24 is about $2E_1/q$ (q is an electric charge 35 of the electron) at a peak voltage ($V_P$), the electrons (hot electrons) are injected from the emitter 26 into the base 24 by a resonant tunneling effect. Accordingly, the electrons pass through the base 24 at an ultra-high speed, go across the collector barrier 23, and then reach the collector 22.

When the base voltage $V_{BE}$ is smaller or larger than $2E_1/q$, it does not meet the conditions for producing resonance tunneling, and an amount of electrons injected into the base 24, i.e., the collector current, is decreased. Therefore, as shown in FIG. 2 in which an example of an emitter ground collector current measured at a temperature of 77° K is shown, the collector current has a peak value at a certain value ($V_P$) of the base voltage $V_{BE}$.

In consequence, an inverter gate using the RHET shows the differential negative resistance characteristics whereby an output is decreased, has a lowest value, and thereafter is increased together with the increase in an input voltage $V_{BE}$. For example, a 2-input exclusive-NOR gate having the following logic mechanism can be constituted with one RHET and three resistance elements, as shown in FIG. 3, although 7 or 8 elements are necessary if transistors are used.

| A | B | C |
|---|---|---|
| 1 | 1 | 1 |
| 0 | 0 | 1 |
| 0 | 1 | 0 |
| 1 | 0 | 0 | in addition to the above-mentioned RHET, the negative differential resistance element may be, for example, an RBT having an n-p-n bipolar transistor structure in which the base layer is p-type. The use of these negative differential resistance elements enables functional effects such as a decrease in the number of elements in a logic circuit, a curtailment of time lags, and the like to be obtained. Therefore, where a desired logic circuit is constituted, it is necessary to mono-lithically integrated a transistor (e.g. FET) having a usual switching mechanism with the differential negative resistance element.

However, the differential negative resistance element is entirely different from an FET in the constitution of a semiconductor multilayer structure, and therefore, the constitution of the semiconductor multilayer structure and the method of producing same are problems in the process of monolithic integration.

SUMMARY OF THE INVENTION

An object of the present invention is to solve the above problems.

Another object of the present invention is to provide a monolithically integrated circuit device comprising a negative differential resistance element and an FET, and a method of easily producing same.

These and other objects of the present invention are attained by providing a semiconductor integrated circuit device comprising a negative differential resistance element and a field effect transistor which are formed on the same semiconductor substrate, a base layer of said negative differential resistance element and a channel layer of said field effect transistor being formed as a same epitaxial layer.

The proposed semiconductor integrated circuit device is realized in accordance with the present invention by a method comprising the steps of: epitaxially growing semiconductor layers on said semiconductor substrate; selectively removing portions of said semiconductor layers; using the same conductive material to simultaneously form an emitter electrode of said negative differential resistance element coming into ohmic contact with the top layer of said semiconductor layers in the unremoved region and a gate electrode of said field effect transistor coming into Schottky contact with one of said semiconductor layers exposed by said selective removal; and using another same conductive material to simultaneously form a base electrode of said negative differential resistance element and a source electrode and a drain electrode of said field effect transistor coming into ohmic contact with said exposed layer of said semiconductor layers.

In the semiconductor integrated circuit according to the present invention, the base layer in the semiconductor layers epitaxially grown on the semiconductor substrate for providing the negative differential element, is used as the channel layer of the FET.

According to the present invention, a top layer of the epitaxially grown semiconductor layers is given a composition and an impurity concentration suitable for ohmic contact, the semiconductor layers are selectively removed by etching to exposed a semiconductor layer thereof suitable for a Schottky contact, and a conductive material is deposited on the top layer and the exposed layer to simultaneously form the emitter electrode of the negative differential resistance element and the Schottky gate electrode of the FET, respectively.

Further, the base electrode of the differential negative resistance element and the source and drain electrodes of the FET are simultaneously made from the same conductive material and are arranged so as to be directly or indirectly brought into ohmic contact with the base layer.

The present invention enables the monolithic integration of the differential negative resistance element and the FET with a rational and easy constitution, and as a result, a semiconductor integrated circuit device having a high performance and a high integrity is realized.

BRIEF DESCRIPTION OF THE DRAWINGS

The present invention will be more apparent from the description of the preferable embodiments set forth below, with reference to the accompanying drawings, in which:

FIG. 1A is a schematic sectional view of an RHET of a negative differential resistance element;

FIG. 1B is an energy band diagram of the RHET of FIG. 1A when a peak voltage is applied;

FIG. 8 is an energy band diagram of the RHET (in a nonbiased condition) of the semiconductor integrated circuit device according to the present invention;

FIGS. 9A and 9B are energy band diagrams of the SBFET (in a nonbiased or biased condition) of the device according to the present invention;

FIG. 10A is an energy diagram of the RHET (in a nonbiased condition) of the device in which a two-dimensional electron gas is generated;

FIGS. 10B and 10C are energy band diagrams of the heterojunction type FET (in a nonbiased or biased condition) of the device in which the two-dimensional electron gas is generated;

FIG. 12A is an energy band diagram of the RBT (in a nonbiased condition) of the device; and FIGS. 12B and 12C are energy band diagrams of the SBFET (in a nonbiased or biased condition) formed together with the RBT.

DESCRIPTION OF THE PREFERRED EMBODIMENTS

Example 1

Figure 2:
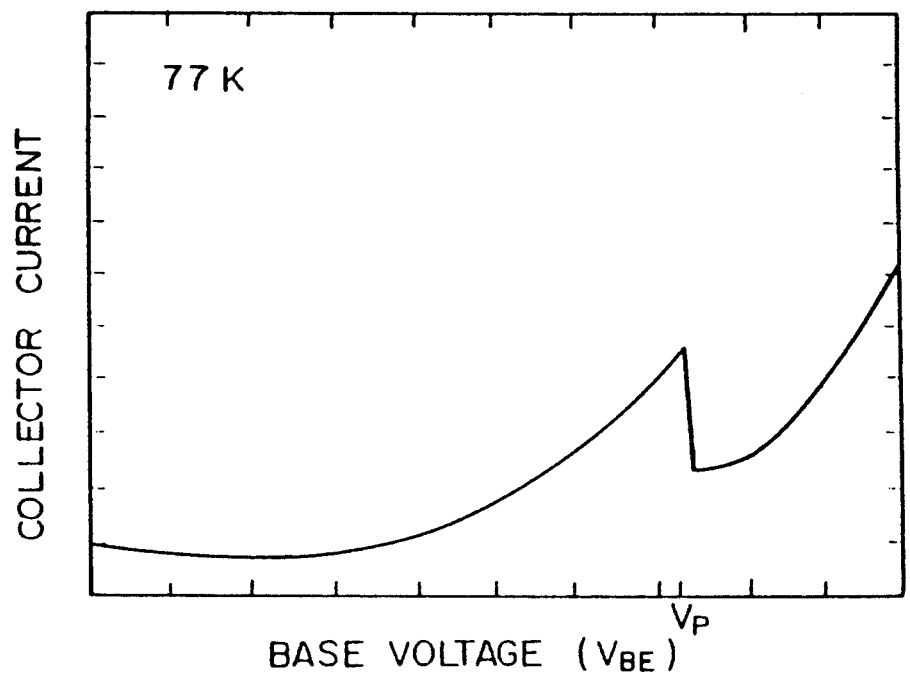
FIG. 2 is a graph of the current-voltage characteristics of the RHET of FIG. 1.
Figure 3:
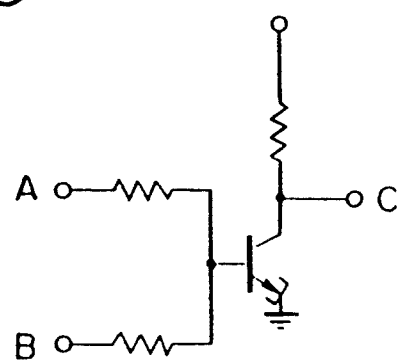
FIG. 3 is a circuit diagram of an EXCLUSIVE-NOR gate.
Figure 4:
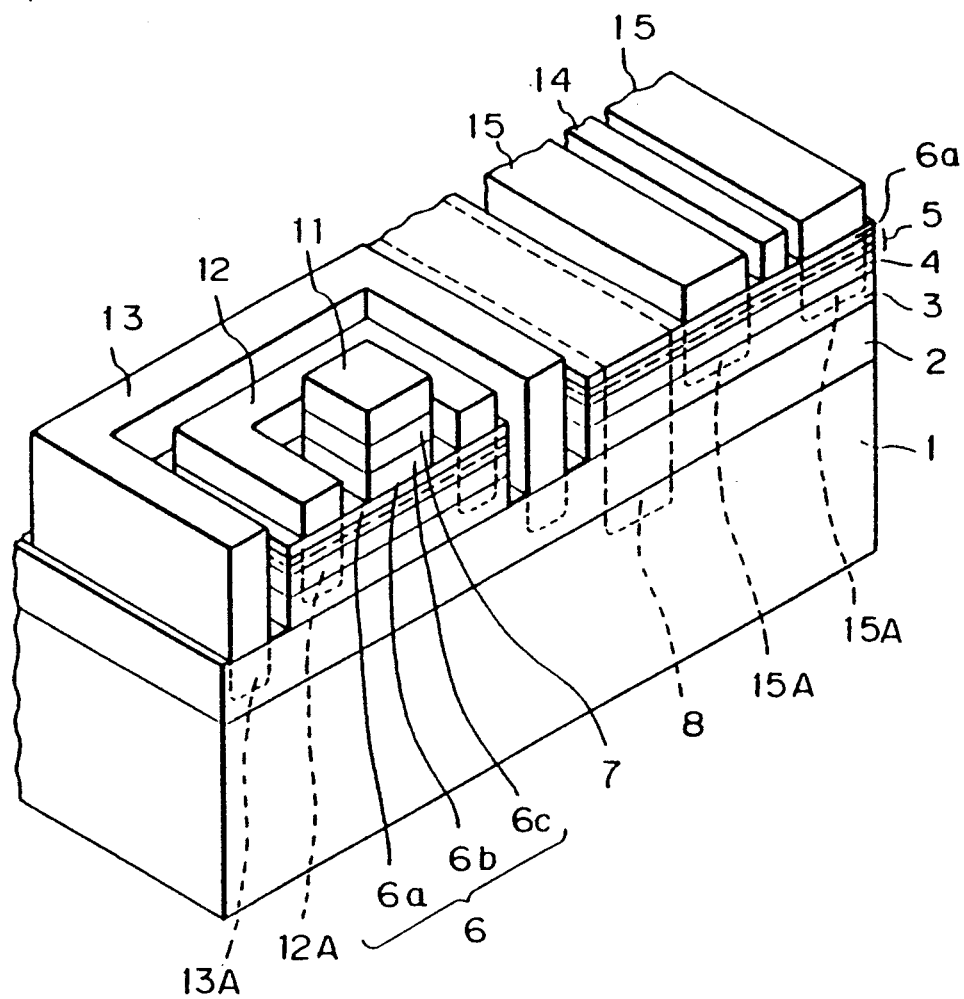
FIG. 4 is a schematic, sectional perspective view of a semiconductor integrated circuit device comprising an RHET and a Schottky barrier type FET (SBFET) according to the present invention.

Referring to FIG. 4, a semiconductor integrated circuit device comprises an RHET and an SBFET, which device is produced as follows and as shown in FIGS. 5A to 5E.

Figure 5A:
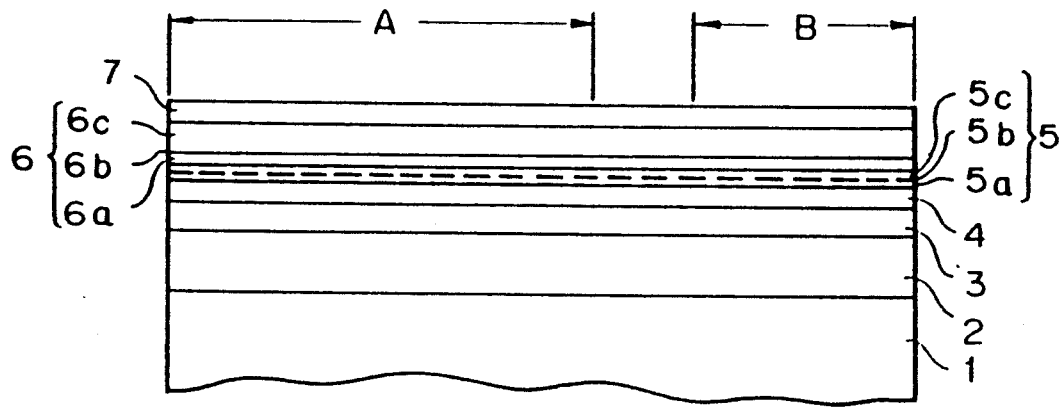
FIGS. 5A to 5E are schematic sectional view of the semiconductor integrated circuit device of FIG. 1 in various stages of production, according to the method of the present invention.

As shown in FIG. 5A, the semiconductor layers shown in Table 2 are successively formed on a semiinsulating GaAs substrate 1 by, e.g., a molecular beam epitaxial growth method.

TABLE 2

| Semiconductor Layer | | Composition | Impurity Dosage $(cm^{-3})$ | Thickness (nm) |
|---|---|---|---|---|
| 2 | Collector | GaAs | $n - 2 \times 10^{18}$ | 400 |
| 3 | Collector Barrier | $Al_{0.16}Ga_{0.84}As$ | Undoped | 200 |
| 4 | Base | GaAs | $n - 5 \times 10^{18}$ | 50 |
| 5 | Emitter Barrier | | | |
| | 5a | $Al_{0.3}Ga_{0.7}As$ | Undoped | 3 |
| | 5b | GaAs | Undoped | 5 |
| | 5c | $Al_{0.3}Ga_{0.7}As$ | Undoped | 3 |
| 6 | Emitter | | | |
| | 6a | GaAs | $n - 5 \times 10^{18}$ | 200 |
| | 6b | $Al_{0.3}Ga_{0.7}As$ | Undoped | 3 |
| | 6c | GaAs | $n - 5 \times 10^{19}$ | 25 |
| 7 | Contact | InGaAs | $n - 5 \times 10^{19}$ | 100 |

In this example, the emitter layer 6 has a triplelayer structure, in which the thin AlGaAs layer 6b serves as a stopper against etching in an etching step described hereinafter. Depending on the thickness of the lower emitter layer 6a, it is possible to foam an SBFET depletion type (normally-on type) element or an enhancement type (normally-off type) element. As the lower emitter layer 6a has a thinner thickness, the SBFET becomes an enhancement type element.

In FIG. 5A, "A" represents the region in which the RHET (resonant tunneling hot electron transistor) is formed, and "B" represents the region in which the SBFET (Schottky barrier type field effect transistor) is formed.

Figure 5B:
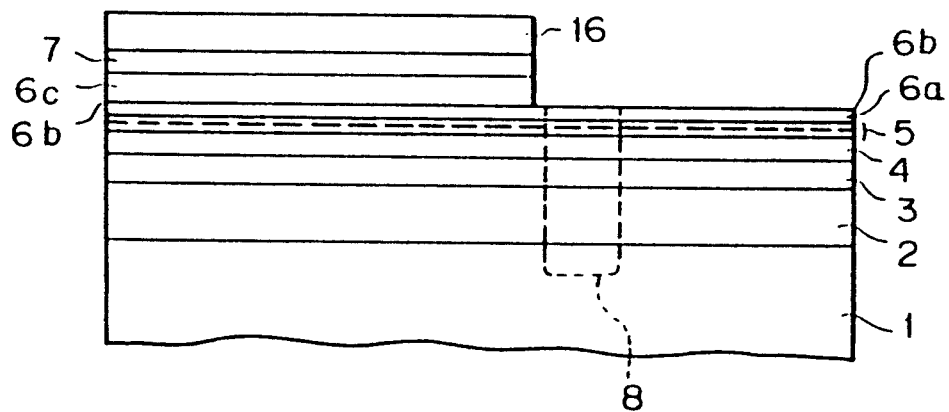

As shown in FIG. 5B, an isolation region 8 for insulating elements from each other is formed by selectively injecting ions, such as boron (B), oxygen (O), or the like into the obtained semiconductor body by an ion-implantation process. It is possible to achieve isolation by forming a V (or U)-shaped groove filled with an insulator, or by a mesa-etching process.

The RHET forming region "A" is covered with a mask 16 (FIG. 5B) of, for example, $SiO_2$ 2 or the like, and an etching process is carried out under a reactive-ion etching method using an etching gas (e.g., $CCl_2F_2$ gas), to selectively remove the n-InGaAs contact layer 7 and the n-GaAs upper emitter layer 6c in the SBFET forming region B and the isolation region 8. The i-AlGaAs middle emitter layer 6b can inhibit the etching process, since the AlGaAs has a much slower etching rate than that of GaAs.

Figure 5C:
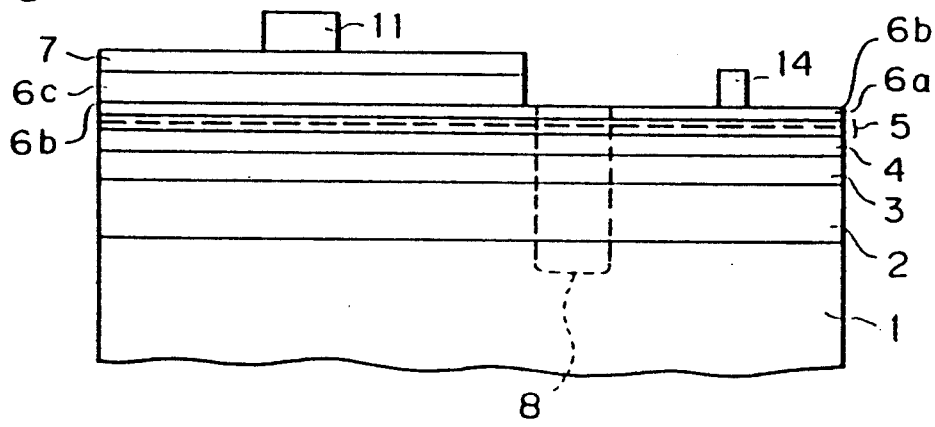

As shown in FIG. 5C, after removal of the mask, a conductive material (e.g., WSi) is deposited on the whole surface by a sputtering method to form a conductive layer having a thickness of about 400 nm, and then the conductive (WSi) layer is patterned by a suitable etching method to form an emitter electrode 11 of the RHET and a gate electrode 14 of the SBFET. At this time, the emitter electrode 11 has an ohmic contact with n-InGaAs contact layer 7 which is smaller band gap and higher doped layer than n-AlGaAs layer 6b, and the gate electrode 14 has a Schottky contact with the n-GaAs layer 6a.

Figure 5D:
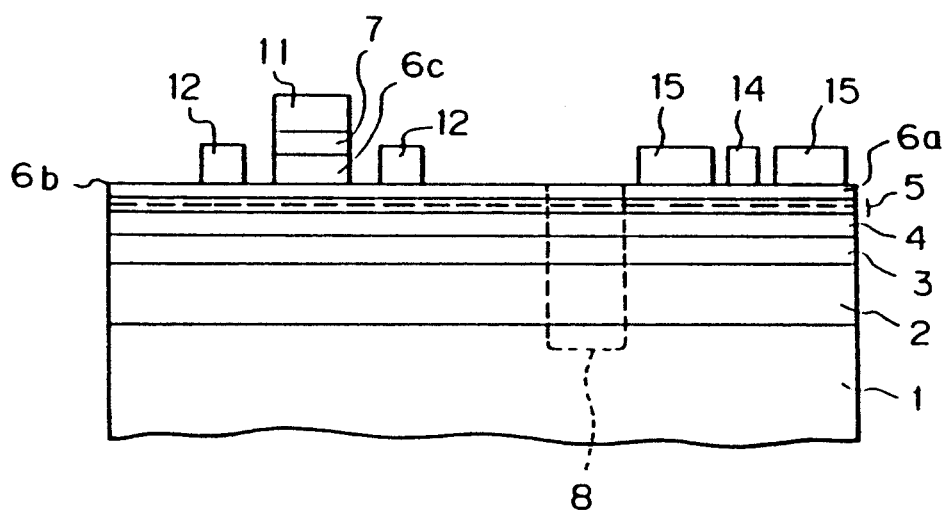

As shown in FIG. 5D, the n-InGaAs contact layer 7 and the n-GaAs upper emitter layer 6c in the RHET forming region "A" are selectively removed by the reactive-ion etching method. In this etching step, a suitable mask (not shown) is formed to cover the exposed surface except for the RHET forming region "A". The emitter electrode 11 serves as a mask and the AlGaAs middle emitter layer 6b serves as a stopper.

Next, a base electrode 12 of the RHET and source and drain electrodes 15 of the SBFET element are formed on the AlGaA middle emitter layer 6b or the GaAs lower emitter layer 6a by, for example, using gold germanium/gold (AuGe/Au) in accordance with a conventional lift-off process. The AlGaAs middle emitter layer 6b is very thin and can be easily removed by a suitable etching method.

Figure 5E:
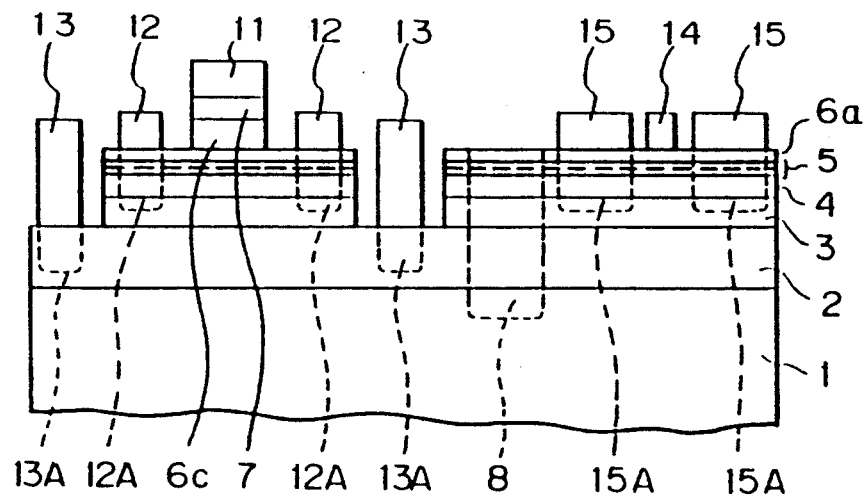

As shown in FIG. 5E, a suitable etching process is carried out outside the base electrode 12, until the n-GaAs collector layer 2 is exposed to a hole for a collector electrode 13. The collector electrode 13 of AuGe/Au or the like is formed on the exposed surface of the collector layer 2 by a lift-off process.

Next, a heat treatment, for example, at 450° C. for about 30 seconds, is performed, to alloy the AuGe and the semiconductor body, with the result that alloyed regions 12A, 13A, and 15A are formed under the base electrode 12, the collector electrode 13, and the source and drain electrodes 15, respectively. These alloyed regions 12A and 15A reach the n-GaAs base layer 4 and electrically connect the base electrode 12 and the source and drain electrodes 15 to the base layer 4, but do not reach the n-GaAs collector layer 2. Accordingly, a semiconductor integrated circuit device comprising the RHET and the SBFET (FIGS. 4 and 5E) is produced. The device has good characteristics equivalent to those of an integrated circuit comprising an RHET and an SBFET which are produced independently and connected with wires. Where a logic circuit is constituted by using the RHET's and SBFET's of the semiconductor circuit device according to the present invention, an intended operation of the logic circuit is satisfactorily achieved.

Example 2

Figure 6:
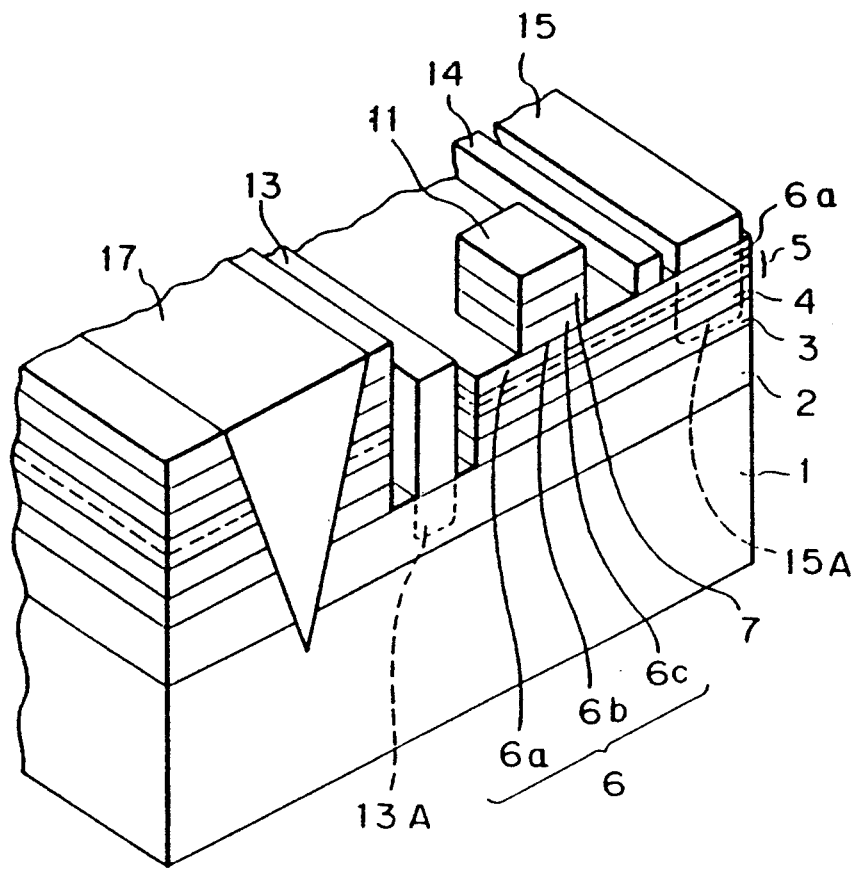
FIG. 6 is a schematic sectional view of a semiconductor integrated circuit device comprising an RHET and SBFET according to another embodiment of the present invention.
Figure 7:
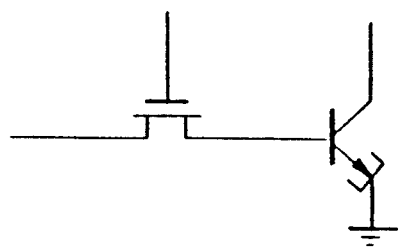
FIG. 7 is a circuit diagram of the semiconductor integrated circuit device of FIG. 6.

Referring to FIG. 6, another semiconductor integrated circuit device is formed similar to that comprising the RHET and the SBFET mentioned in Example 1. Namely, the semiconductor integrated circuit device is the same as that of Example 1, except that (a) a base electrode of the RHET and a source electrode of the SBFET are not formed, and (b) a V-shaped groove filled with insulator is used for the isolation of insulating elements from each other. Accordingly, the same parts in FIG. 6 as in FIG. 4 are given the same reference numerals. In this case, the n-GaAs layer 4 of the base layer of the RHET of the channel layer of the SBFET is not divided between the RHET and the SBFET, namely the base of the RHET and the source of the SBFET are directly connected. Therefore, the semiconductor integrated circuit device of Example 2 has an electric circuit as shown in FIG. 7. In Example 1, when the base electrode 12 is connected to the source electrode 15 (FIG. 4) with a wire (not shown), the electric circuit of FIG. 7 is realized.

The process for producing this semiconductor integrated circuit device is the same as that used in Example 1 except for the following.

(a) After the epitaxial formation of the semiconductor layers 2 to 7, a V-shaped groove is formed by anisotropic etching and is filled with an insulator 17, such as $SiO_2$ and polycrystalline silicon, instead of the ion-implantation step for the isolation.

(b) Only the drain electrode 15 of AuGe/Au is formed by using a lift-off process, instead of the three electrode (i.e., base electrode, source electrode and drain electrode) formed in Example 1.

As shown in FIG. 8, the energy band diagram of the RHET of the semiconductor integrated circuit devices of Examples 1 and 2 is obtained in a nonbiased state. The energy band diagram of the RHET in a biased state is similar to that of FIG. 1B. The energy band diagram of the SBFET is shown in FIG. 9A (in a nonbiased state) and FIG. 9B (in a biased state, i.e., a negative voltage $V_G$ applied to the gate electrode 14). The existence of the collector barrier (i-AlGaAs layer) 3 of the RHET under the channel layer 4 of the SBFET greatly improves the threshold voltage ($V_{th}$) characteristics of the SBFET. As shown in FIGS. 9A and 9B, carriers of electrons existing in the channel layer 4 in the nonbiased state are pushed out by applying the biased voltage $V_G$ to the gate, so that the border of ON/OFF conditions of the FET is made clearer.

Example 3

It is possible to form a heterojunction type FET using a two-dimensional electron gas (2DEG), instead of the SBFET of the semiconductor integrated circuit device of Examples 1 and 2. In this case, a multilayer structure of semiconductor layers epitaxially grown on a semiinsulating GaAs substrate is substantially the same as that of Example 1, except that the collector barrier layer 3 of the RHET is formed of n-AlGaAs (instead of the i-AlGaAs of Example 1) and the base layer 4 of the RHET is formed of i-GaAs (instead of the n-GaAs of Example 1). Therefore, the n-AlGaAs collector barrier layer 3 serves as an electron supplying layer and the 2DEG is generated in the i-GaAs base layer 4.

In this case, semiconductor layers as shown in Table 3 are successively epitaxially formed on the semiinsulating GaAs substrate 1.

TABLE 3

| Semiconductor Layer | Composition |
| --- | --- |
| 2 Collector | n-GaAs |
| 3 Collector Barrier | n-AlGaAs |
| 4 Base | i-GaAs |
| 5 Base Barrier | |
| 5a | i-AlGaAs |
| 5b | i-GaAs |
| 5c | i-AlGaAs |
| 6 Emitter | |
| 6a | n-GaAs |
| 6b | i-AlGaAs |
| 6c | n-GaAs |
| 7 Contact | n-InGaAs |

The semiconductor integrated circuit device comprising the RHET and the heterojunction type FET is produced in a similar manner to the process used in Example 1 or Example 2.

The energy band diagram of the RHET in a nonbiased state is shown in FIG. 10A. The 2DEG is generated in the base layer (i-GaAs) 4 and near the collector barrier (n-AlGaAs) 3. The energy band diagram of the heterojunction FET is shown in FIG. 10B (in a nonbiased state) and FIG. 10C (in a biased state), i.e., a negative voltage $V_G$ is applied to the gate). In this case, since the heterojunction type FET is a normally-ON (depletion) type, in the biased state a depletion layer is generated in the channel layer 4 (i.e., i-GaAs base layer) to make it OFF. It is possible to produce a normally-OFF (enhancement) type FET, in accordance with the n-GaAs lower emitter layer (i.e., contact layer of the FET) 6a. The FET is operated at a high speed by the 2DEG, and the RHET has an increased gain and an increased operating speed, since a low base resistance is maintained and the base layer thickness is thin.

Example 4

It is possible to produce a semiconductor integrated circuit device comprising the SBFET and a resonant tunneling bipolar transistor (RBT) having a negative differential resistance element, instead of the RHET.

Figure 11A:
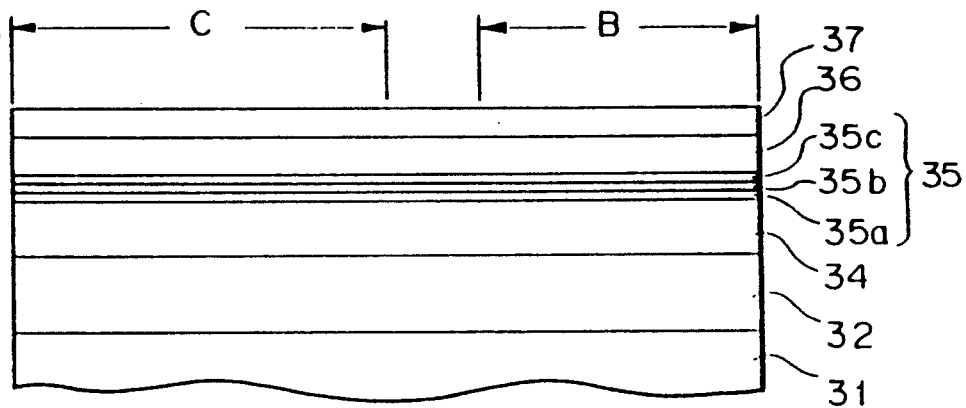
FIGS. 11A and 11B are schematic sectional views of the device comprising the RBT and SBFET in various stages of production according to the method of another embodiment of the present invention.

As shown in FIG. 11A, semiconductor layers as shown in Table 4 are successively formed on a semiinsulating GaAs substrate 31 by a molecular beam epitaxial growth method.

TABLE 4

| Semiconductor Layer | Composition |
| --- | --- |
| 32 Collector | n-GaAs |
| 34 Base | p-GaAs |
| 35 Emitter Barrier | |
| 35a | i-AlGaAs |
| 35b | i-GaAs |
| 35c | i-AlGaAs |
| 36 Emitter | n-AlGaAs |
| 37 Contact | n-InGaAs |

In FIG. 11A, "C" represents the region in which the RBT is formed, and "B" represents the region in which the SBFET is formed. The isolation (not shown) is attained by the ion-implanted region of Example 1 or the V-shaped groove filled with an insulator of Example 2.

Figure 11B:
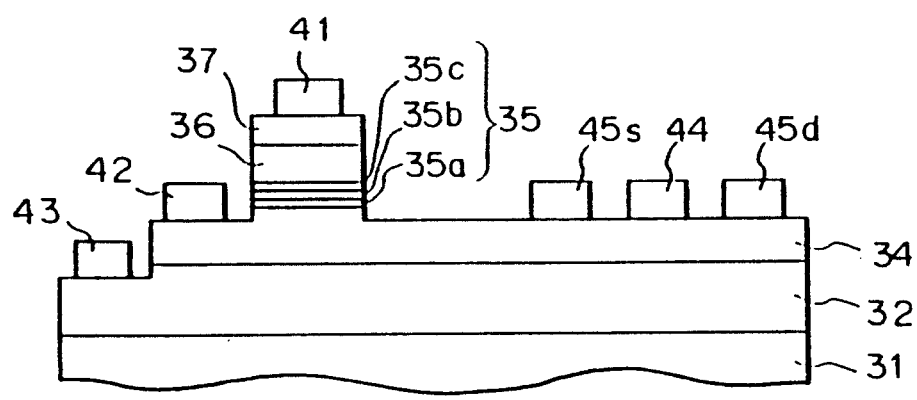

In the RBT forming region "C" the contact layer 37 is covered with a mask (not shown) formed of SiO$_2$ or the like and having a size slightly larger than an emitter electrode 41, and the contact layer 37, emitter layer 36, and emitter barrier layer 35 are selectively removed by an etching process to expose the base layer 34, as shown in FIG. 11B. At the etching step, an upper portion of the base layer 34 is etched. After removal of the mask, a resist pattern (not shown) having openings for an emitter electrode and a gate electrode is applied over the entire surface, a conductive material (e.g., WSi) is deposited by a sputtering method, and the resist pattern is removed to form an emitter electrode 41 on the contact layer 37 and a gate electrode 44 on the base layer 34, at the same time. For the formation of a collector electrode, another resist pattern is applied over the entire surface, and the base layer 34 and an upper portion of the collector layer 32 are selectively removed by an etching process. Next, another resist pattern having openings for electrodes is applied over the entire surface, another conductive material (e.g., AuGe/Au) is deposited by a vacuum deposition process, and the resist pattern is removed to form a base electrode 42, a source electrode 45s, and a drain electrode 45d on the p-GaAs layer 34 and a collector electrode 43 on the n-GaAs collector layer 32, at the same time. Thus the semiconductor integrated circuit device (FIG. 11B) comprising the RBT and the SBFET is obtained.

The energy band diagram of the RBT in a nonbiased state is shown in FIG. 12A. The energy band diagram of the SBFET is shown in FIG. 12B (in a nonbiased state) and FIG. 12C (in a biased state). The SBFET has a p-channel in which the carriers are holes. In this case, since the SBFET is a normally-ON (depletion) type, in the nonbiased state (i.e., no voltage is applied to the gate) holes are generated in the channel layer (i.e., p-GaAs base layer) 34, whereby the FET is made ON. When a positive voltage ($V_G$) is applied to the gate, a depletion layer is generated in the channel layer to make the SBFET OFF. At the switching the existence of the n-GaAs collector layer 32 under the channel layer 34 of the SBFET, and the barrier action thereof, provided improved threshold voltage ($V_{th}$) characteristics of the SBFET. As described above, according to the present invention, the monolithic integration of the negative differential resistance element and the field effect transistor can be rationally and easily accomplished. Therefore, in constituting a logic circuit or the like, both the element and transistor can be optionally selected, and thus a remarkable decrease in the number of elements used and a shortening of the time lag can be realized. It will be obvious that the present invention is not restricted to the above-mentioned embodiments and that many variations are possible for persons skilled in the art without departing from the scope of the invention.

I claim:

1. A method of producing a semiconductor integrated circuit device composed of a negative differential resistance element and a field effect transistor which are formed on the same semiconductor substrate, a base layer of said negative differential resistance element and a channel layer of said field effect transistor being formed as the same epitaxial layer, said method comprising the steps of:

epitaxially growing semiconductor layers on said semiconductor substrate;

selectively removing portions of said semiconductor layers;

using the same conductive material to simultaneously form emitter electrode of said negative differential resistance element being in ohmic contact with the top layer of said semiconductor layers in the unremoved region and a gate electrode of said field effect transistor being in Schottky contact with one of said semiconductor layers exposed by said selective removal; and using another same conductive material to simultaneously form a base electrode of said negative differential resistance element and a source electrode and a drain electrode of said field effect transistor being in electrical connection with said exposed layer of said semiconductor layers.

2. A method according to claim 1, wherein a semiinsulating GaAs substrate is used as said semiconductor substrate, an n-GaAs collector layer, an i-AlGaAs collector barrier layer, an n-GaAs base layer, an i-AlGaAs-/i-GaAs/i-AlGaAs multilayer emitter barrier layer having a resonant tunneling barrier structure, an n-GaAs emitter layer and an n-InGaAs emitter contact layer are successively epitaxially grown on the substrate as said semiconductor layers for said negative differential resistance element and for said field effect transistor, the n-InGaAs emitter contact layer and a portion of the n-GaAs emitter layer are selectively removed by etching, and said gate electrode is then formed on the remaining portion of said emitter layer.

3. A method according to claim 1, wherein a semiinsulating GaAs substrate is used as said semiconductor substrate, an n-GaAs collector layer, an n-AlGaAs collector barrier layer, an i-GaAs base layer, an i-AlGaAs-/i-GaAs/i-AlGaAs multilayer emitter barrier layer having a resonant tunneling barrier structure, an n-GaAs emitter layer and an n-InGaAs emitter contact layer are successively epitaxially grown on the substrate as said semiconductor layers for said negative differential resistance element, and for said field effect transistor, the n-InGaAs emitter contact layer and a portion of the n-GaAs emitter layer are selectively removed by etching, and said gate electrode is then formed on the remaining portion of said emitter layer.

4. A method according to claim 1, wherein a semiinsulating GaAs substrate is used as said semiconductor substrate, an n-GaAs collector layer, a p-GaAs base layer, an i-AlGaAs/i-GaAs/i-AlGaAs multilayer emitter barrier layer having a resonant tunneling barrier structure, an n-AlGaAs emitter layer and an n-InGaAs emitter contact layer are successively epitaxially grown on the substrate as said semiconductor layers for said negative differential resistance element and for said field effect transistor, the n-InGaAs emitter contact layer, the n-GaAs emitter layer and the multilayer emitter barrier layer are selectively removed by etching, and said gate electrode is then formed on the p-GaAs base layer.

5. A method of producing a semiconductor integrated circuit device composed of a negative differential resistance element and a field effect transistor which are formed on the same semiconductor substrate, a base layer of said negative differential resistance element and a channel layer of said field effect transistor being formed as the same epitaxial layer, said method comprising the steps of:

epitaxially growing semiconductor layers on said semiconductor substrate;

selectively removing portions of said semiconductor layers;

using the same conductive material to simultaneously form an emitter electrode of said negative differential resistance element being in ohmic contact with the top layer of said semiconductor layers in the unremoved region and a gate electrode of said field effect transistor being in Schottky contact with one of said semiconductor layers exposed by said selective removal; and forming a drain electrode of said field effect transistor being in ohmic contact with said exposed layer of said semiconductor layers.

* * * * *